(12) United States Patent
Bindseil et al.

(10) Patent No.: US 11,821,970 B2
(45) Date of Patent: *Nov. 21, 2023

(54) GRADIENT COIL APPARATUS AND METHODS FOR MRI

(71) Applicant: SYNAPTIVE MEDICAL INC., Toronto (CA)

(72) Inventors: Geron André Bindseil, London (CA); Ian Robert Oliphant Connell, Toronto (CA); William Bradfield Handler, London (CA); Chad Tyler Harris, Toronto (CA)

(73) Assignee: Synaptive Medical Inc.

( * ) Notice: Subject to any disclaimer, the term of this patent is extended or adjusted under 35 U.S.C. 154(b) by 0 days.

This patent is subject to a terminal disclaimer.

(21) Appl. No.: 17/645,108

(22) Filed: Dec. 20, 2021

(65) Prior Publication Data

US 2022/0137167 A1    May 5, 2022

Related U.S. Application Data

(63) Continuation of application No. 16/570,892, filed on Sep. 13, 2019, now Pat. No. 11,249,157.

(51) Int. Cl.
*G01R 33/385* (2006.01)

(52) U.S. Cl.
CPC ..... *G01R 33/3856* (2013.01); *G01R 33/3858* (2013.01)

(58) Field of Classification Search
CPC ............ G01R 33/3856; G01R 33/3858; G01R 33/283; G01R 33/3802
See application file for complete search history.

(56) References Cited

U.S. PATENT DOCUMENTS

| | | | |
|---|---|---|---|
| 3,192,305 | A | 6/1965 | Erbe |
| 3,551,581 | A | 6/1970 | Goodman |
| 4,780,676 | A | 10/1988 | Muller |
| 2003/0141870 | A1 | 7/2003 | Schuster |
| 2005/0168222 | A1* | 8/2005 | Arz ............... G01R 33/3856 324/318 |

(Continued)

FOREIGN PATENT DOCUMENTS

| | | |
|---|---|---|
| CA | 3092977 | 3/2021 |
| GB | 2591000 | 7/2021 |

OTHER PUBLICATIONS

Search report issued by the Intellectual Property Office of the UK in relation to GB Application No. GB2014358.2 dated Feb. 25, 2021, 2 pgs.

(Continued)

*Primary Examiner* — Daniel R Miller

(57) ABSTRACT

A coil apparatus and methods for magnetic resonance imaging involving a wire winding, the wire winding having at least one of: a hollow cross-section wire and a solid cross-section wire, the solid cross-section wire having at least one of: a solid small cross-section wire and a solid large cross-section wire, the solid large cross-section wire having a thickness greater than that of the solid small cross-section wire, and the solid small cross-section wire disposed in one of adjacent and proximate at least one of the hollow cross-section wire and the solid large cross-section wire, whereby at least one of current density, winding density, and heat extraction are increasable.

19 Claims, 9 Drawing Sheets

(56) References Cited

U.S. PATENT DOCUMENTS

| | | |
|---|---|---|
| 2007/0063705 A1 | 3/2007 | Ham |
| 2015/0177347 A1 | 6/2015 | Tsujita |
| 2017/0038444 A1 | 2/2017 | Seeber |
| 2017/0059675 A1 | 3/2017 | Moon |
| 2018/0156880 A1 | 6/2018 | Lin |
| 2020/0049780 A1 | 2/2020 | Stocker |
| 2020/0072923 A1 | 3/2020 | Mulder |
| 2020/0088818 A1 | 3/2020 | Thiagarajan |
| 2021/0080528 A1 | 3/2021 | Bindseil et al. |

OTHER PUBLICATIONS

Handler et al., New Head Gradient Coil Design and Construction Techniques, Journal of Magnetic Resonance Imaging 39:1088-1095, 2014 (Year: 2014).

* cited by examiner

GRADIENT COIL APPARATUS AND METHODS FOR MRI

CROSS-REFERENCE TO RELATED APPLICATION(S)

This document is a continuation application claiming the benefit of, and priority to, U.S. patent application Ser. No. 16/570,892, filed on Sep. 13, 2019, and entitled "GRADIENT COIL APPARATUS AND METHODS FOR MRI," which is hereby incorporated by reference in its entirety.

FIELD

Generally, the present disclosure relates to the field of magnetic resonance imaging (MRI). More particularly, the present disclosure relates to the field of MRI apparatuses and methods. Even more particularly, the present disclosure relates to the field of MRI coil apparatuses and methods.

BACKGROUND

In the related art, Z-gradient coils for MRI are configured by disposing solenoidal windings around a cylinder in a housing. One such related art Z-gradient coil comprises two hollow segments, wherein the first hollow segment has a first width, wherein the second hollow segment has a second width, wherein the first width is different from the second width, and wherein the first hollow segment and the second hollow segment are wound adjacent one another. These related art windings are fabricated from wire having a hollow internal channel for flowing coolant to remove heat therefrom and/or from other devices within the housing, such as transverse gradient coil layers. However, these related art coils have experienced challenges, including a structural constraint on the wire's width in the "adjacent" configuration, thereby restricting a minimum wire separation of the Z-gradient coil and introducing limits on performance. The all-hollow wire approach in the related art experiences a lower realistic limit to the wire width as the all-hollow wires must support a channel for coolant flow with reasonable flow rate.

Therefore, many continuing needs exist in the related art for improvements in the field of MRI. For example, a need exists in the related art for an MRI coil apparatus and methods that enhance at least one of current density, winding density, and heat extraction.

SUMMARY

The present disclosure addresses at least many of the foregoing challenges experienced by related art. The subject matter of the present disclosure involves a gradient coil apparatus and methods for MRI that addresses at least one of the foregoing challenges in the related art, such as limited current density, limited winding density, and inefficient heat extraction. The gradient coil apparatus and methods of the present disclosure eliminate the related art constraint problems which require using wires of the same width in a gradient coil or using wires of different width in an unduly inefficient arrangement, e.g., in a hollow-wire-to-hollow-wire "adjacent" winding arrangement. Generally, the gradient coil apparatus and methods of the present disclosure have a "hybrid" configuration which uses a hollow wire and a solid wire in one of adjacent and proximate the hollow wire, e.g., a hollow-wire-to-solid-wire adjacent arrangement or proximate arrangement, wherein the solid wire has a cross section being smaller than that of the hollow wire, and wherein the solid wire is cooled by the hollow wire. The gradient coil apparatus and methods of the present disclosure further eliminate the related art need for coolant adapters for at least that the solid wire and hollow wire combination is implementable in a plurality of winding configurations. For example, in the gradient coil apparatus and methods of the present disclosure, the wires are disposable in a plurality of radial positions, whereby electromagnetic performance characteristics are customizable for a particular implementation. Optionally, the gradient coil and methods of the present disclosure involve a device that can be fabricated in an arrangement that is smaller than those in the related art for at least that the hybrid arrangement of solid wires and hollow wires facilitates fabricating an overall arrangement, e.g., a winding, that is smaller in cross-section than possible in a related art hollow wire configuration, thereby increasing performance, given specific geometric constraints for the disposition of the gradient coil windings, e.g., for a given implementation.

In accordance with an embodiment of the present disclosure, a coil apparatus for magnetic resonance imaging comprises: at least one wire winding, the at least one wire winding comprising at least one of at least one hollow cross-section wire and at least one solid cross-section wire, the at least one solid cross-section wire comprising at least one of at least one solid small cross-section wire and at least one solid large cross-section wire, the at least one solid large cross-section wire having a cross-sectional area greater than that of the at least one solid small cross-section wire, and the at least one solid small cross-section wire disposed in one of adjacent and proximate at least one of the at least one hollow cross-section wire and the at least one solid large cross-section wire, whereby at least one of current density, winding density, and heat extraction are increasable. In alternative embodiments, other types of coils are configurable by using a winding pattern for a hollow conductor, whereby current density is also increasable, such as in a transverse orientation, e.g., X-gradient coils and Y-gradient coils, as well as shim coils, and any other resistive electromagnet configuration. In other alternative embodiments, coils are configurable by using a plurality of solid wires of different widths for effecting different winding densities in an efficient arrangement, e.g., in electromagnetic configurations where certain locations require a high winding density and other locations do not require a high winding density, for implementations, such as when cooling is not required and when cooling is provided by another cooling source.

In accordance with an embodiment of the present disclosure, a method of fabricating a coil apparatus for magnetic resonance imaging comprises: providing at least one wire winding, providing the at least one wire winding comprising providing at least one of at least one hollow cross-section wire and at least one solid cross-section wire, providing the at least one solid cross-section wire comprising providing at least one of at least one solid small cross-section wire and at least one solid large cross-section wire, providing the at least one solid large cross-section wire comprising providing the at least one solid large cross-section wire having a cross-sectional area greater than that of the at least one solid small cross-section wire, and providing the at least one solid small cross-section wire comprising disposing the at least one solid small cross-section wire in one of adjacent and proximate at least one of the at least one hollow cross-section wire and the at least one solid large cross-section wire, whereby at least one of current density, winding density, and heat extraction are increasable.

In accordance with an embodiment of the present disclosure, a method of increasing at least one of current density, winding density, and heat extraction for magnetic resonance imaging by way of a coil apparatus, comprises: providing the coil apparatus, providing the apparatus comprising providing at least one wire winding, providing the at least one wire winding comprising providing at least one of at least one hollow cross-section wire and at least one solid cross-section wire, providing the at least one solid cross-section wire comprising providing at least one of at least one solid small cross-section wire and at least one solid large cross-section wire, providing the at least one solid large cross-section wire comprising providing the at least one solid large cross-section wire having a cross-sectional area greater than that of the at least one solid small cross-section wire, and providing the at least one solid small cross-section wire disposed in one of adjacent and proximate at least one of the at least one hollow cross-section wire and the at least one solid large cross-section wire, whereby at least one of current density, winding density, and heat extraction are increasable; and applying a current through the gradient coil apparatus, thereby increasing at least one of current density, winding density, and heat extraction.

Some of the features in the present disclosure are broadly outlined in order that the section entitled Detailed Description is better understood and that the present contribution to the art is better appreciated. Additional features of the present disclosure are described hereinafter. In this respect, understood is that the present disclosure is not limited in its application to the details of the components or steps set forth herein or as illustrated in the several figures of the Drawing being carried out in various ways. Also, understood is that the phraseology and terminology employed herein are for the purpose of the description and should not be regarded as limiting.

BRIEF DESCRIPTION OF THE DRAWING

The above, and other, aspects, features, and advantages of several embodiments of the present disclosure will be more apparent from the following Detailed Description as presented in conjunction with the following several figures of the Drawing.

Figure 1:
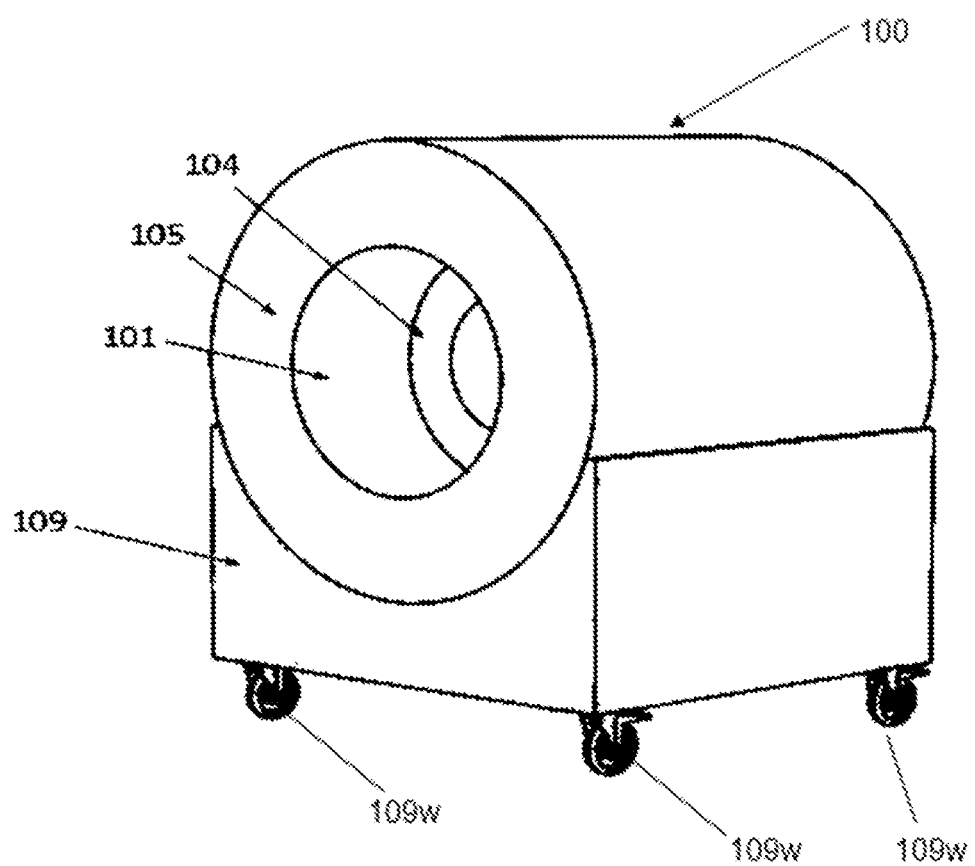
FIG. 1 is a diagram illustrating, in a perspective view, an MRI system, in accordance with an embodiment of the present disclosure.

Corresponding reference numerals or characters indicate corresponding components throughout the several figures of the Drawing. Elements in the several figures are illustrated for simplicity and clarity and have not necessarily been drawn to scale. For example, the dimensions of some elements in the several figures may be emphasized relative to other elements for facilitating understanding of the various presently disclosed embodiments. Also, common, but well-understood, elements that are useful or necessary in a commercially feasible embodiment are often not depicted to facilitate a less obstructed view of these various embodiments of the present disclosure.

DETAILED DESCRIPTION

Various embodiments and aspects of the present disclosure will be described with reference to the below details. The following description and drawings are illustrative of the present disclosure and are not to be construed as limiting the disclosure. Numerous specific details are described to provide a thorough understanding of various embodiments of the present disclosure. However, in certain instances, well-known or conventional details are not described to provide a concise discussion of the embodiments of the present disclosure.

As used herein, the terms "comprises" and "comprising" are to be construed as being inclusive and open-ended, and not exclusive. Specifically, when used in the specification and the claims, the terms "comprises," and "comprising," and variations thereof denote the specified features, steps, or components are included. These terms are not to be interpreted to exclude the presence of other features, steps, or components.

As used herein, the terms "sample," "example," or "exemplary" denote "serving as an example, instance, or illustration," and should not be construed as preferred or advantageous over other configurations disclosed herein.

As used herein, the terms "about" and "approximately" denote variations that may exist in the upper and lower limits of the value ranges, such as variations in properties, parameters, and dimensions. In one non-limiting example, the terms "about" and "approximately" denote plus or minus approximately 10 percent or less.

Referring to FIG. 1, this diagram illustrates a perspective view of an MRI system 100, in accordance with an embodiment of the present disclosure. The MRI system 100 comprises a magnet housing 105 disposed in relation to a base 109. By example only, the base 109 comprises a portable cart having a plurality of wheels 109w. In some installations, the base 109 may be affixed to the floor of the scanning room (not shown). The magnet housing 105 comprises a solenoid magnet, e.g., as a component of a coil assembly 104 (FIG. 2) and a bore 101A for accommodating a patient 103 for scanning. The solenoid magnet may operate as the main magnet for the MRI system 100. The solenoid magnet generates a substantially uniform magnetic field for imaging the patient disposed within the bore 101A. This magnetic field is operable as a static polarizing field.

Figure 2:
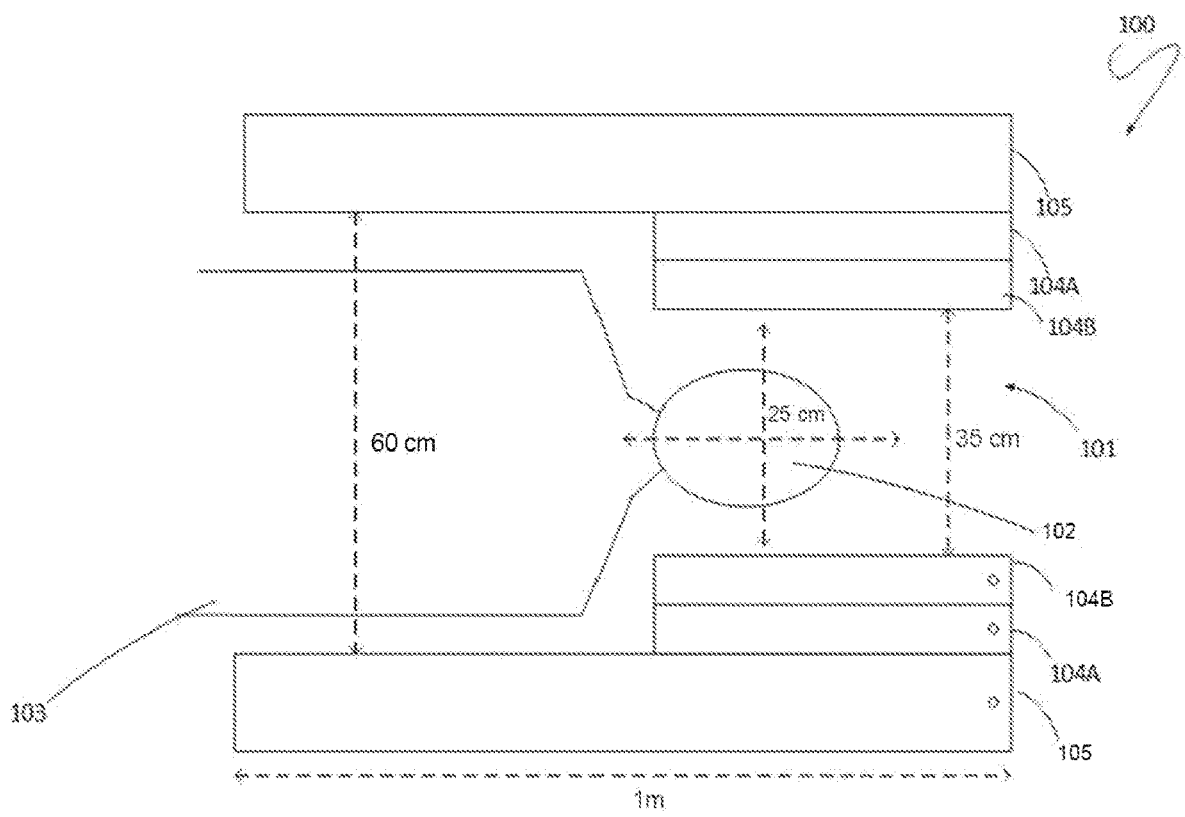
FIG. 2 is a diagram illustrating, in a top cross-sectional view, the MRI system, as shown in FIG. 1, accommodating a patient, in accordance with an embodiment of the present disclosure.

Referring to FIG. 2, this diagram illustrates a top cross-sectional view of the MRI system 100, as shown in FIG. 1, accommodating a patient 103, in accordance with an embodiment of the present disclosure. The patient 103 is disposable in the bore 101A. In this example, a patient head 102 is disposed within a magnetic field for imaging by a coil assembly 104. The coil assembly 104 is configured as an annular structure and is disposed in the bore 101A of the magnet housing 105. In this example, the coil assembly 104 comprises a gradient coil 104A and an RF coil 104B. The gradient coil 104A generates a perturbation of the static polarizing field to encode magnetizations within the patient 103.

Still referring to FIG. 2, in some configurations, the coil assembly 104 comprises an RF coil 104B for transmitting RF pulses as excitation pulses. The RF coil 104B is configurable to receive MR signals from the patient 103 in response to the RF pulses. In some instances, the magnet housing 105 comprises separate "receive" coils to receive the MR signals from the patient 103. In these instances, RF signals are, for example, transmitted by local coils for imaging a subject, such as the patient 103. In one example, a head coil in a birdcage configuration (FIG. 3) is used for both transmitting and receiving RF signals for imaging the patient head 102. In another instance, a surface coil is used for transmitting an RF signal into the subject, e.g., the patient 103, and a phased array coil configuration (not shown) is used for receiving MR signals in response thereto.

Figure 3:
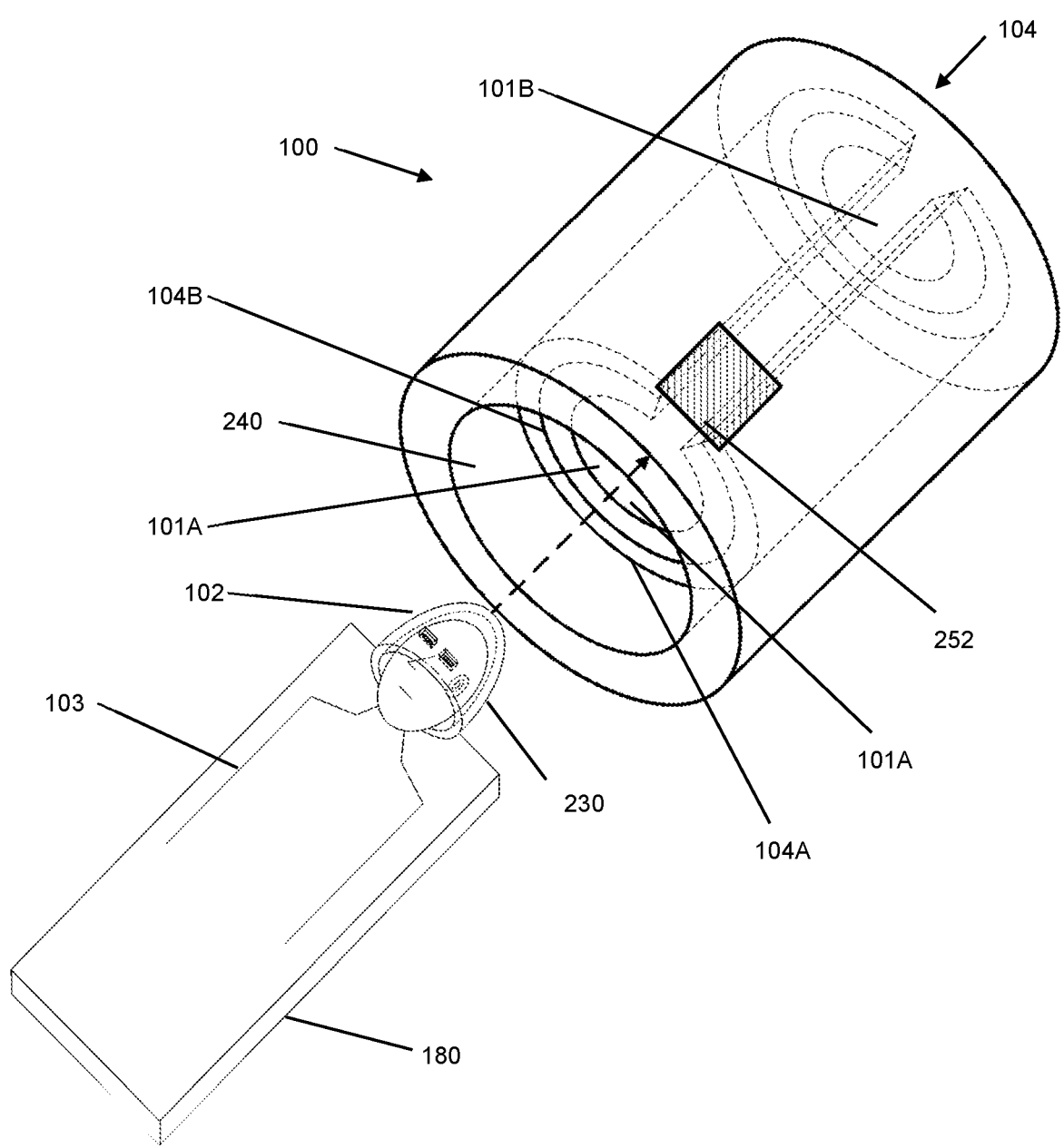
FIG. 3 is a diagram illustrating, in a perspective view, the MRI system as shown in FIG. 1, ready to accommodate a patient, the MRI system having a coil assembly with an aperture formed therein, in accordance with an embodiment of the present disclosure.

Referring to FIG. 3, this diagram illustrates a perspective view of the MRI system 100, as shown in FIG. 1, ready to accommodate a patient 103, the MRI system 100 having a coil assembly 104 disposed in an aperture 101B formed therein, in accordance with an embodiment of the present disclosure. The patient 103 is supported by a table or stretcher 180. The MRI system 100 further comprises a head coil 230 for accommodating the patient head 102. The table or stretcher 180 transports the patient 103 into the bore 101A of the MRI system 100. For example, the head coil 230 is configurable as an RF receiver coil operable as a local coil. In this example, the head coil 230 is configured to receive RF signals that are emitted from within the patient head 102, such emitted RF signals being in response to excitation RF pulses transmitted from the transmitter coil 104B within the coil assembly 104. In another example, the head coil 230 is configurable as an RF transmitter-and-receiver coil.

Still referring to FIG. 3, in this embodiment, the aperture 101B accommodates at least one electronic device 252, such as a display device, screen, and/or camera. The MRI system 100 comprises an initial gap region 240 configured to accommodate the shoulders and the torso of the patient 103. The receiving coil, e.g., the head coil 230, is disposable about the patient 103 in relation to the aperture 101B as desired, prior to moving the patient head 102 into the bore 101A in alignment with the aperture 101B. In this embodiment, the coil assembly 104 comprises the gradient coil 104A and transmitting coil 104B.

Figure 4:
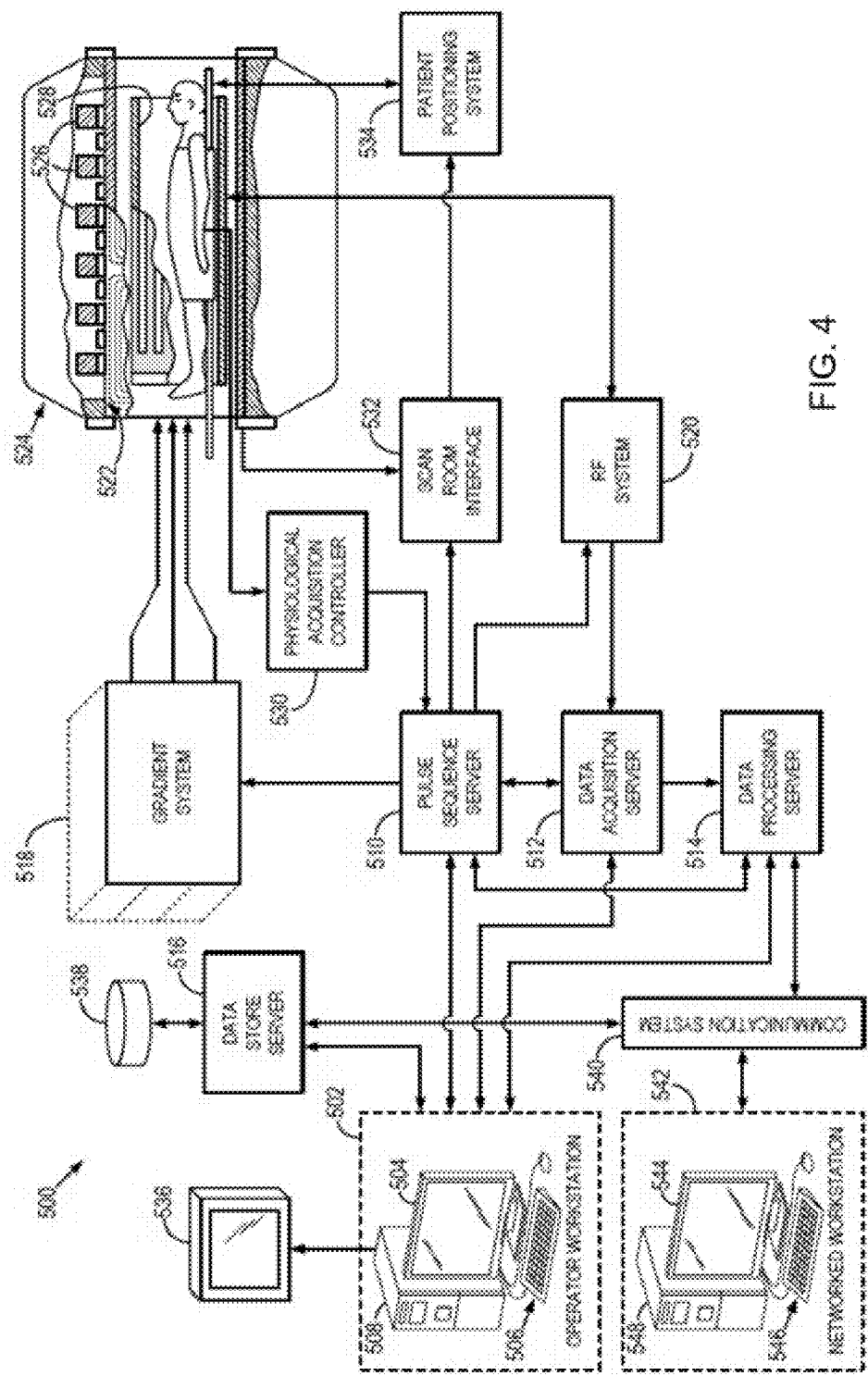
FIG. 4 is a schematic block diagram illustrating an MRI system, accommodating a patient, the MRI system having a gradient system, in accordance with an embodiment of the present disclosure.

Referring to FIG. 4, this schematic block diagram illustrates an MRI system 500, accommodating a patient 103, the MRI system 500 having a gradient system 518, in accordance with an embodiment of the present disclosure. The MRI system 500 comprises an operator workstation 502, the operator workstation 502 comprising a display 504, one or more input devices 506, such as a keyboard and mouse, and a processor 508. The processor 508 may include a commercially available programmable machine running a commercially available operating system. The operator workstation 502 provides the operator interface that enables scan prescriptions to be entered into the MRI system 500. In general, the operator workstation 502 may be coupled to four servers: a pulse sequence server 510; a data acquisition server 512; a data processing server 514; and a data store server 516. The operator workstation 502 and each server 510, 512, 514, and 516 are connected to communicate with each other. For example, the servers 510, 512, 514, and 516 are connected via a communication system 540, the communication system 540 comprising any suitable network connection, whether wired, wireless, or a combination of both. As an example, the communication system 540 comprises at least one of proprietary networks, dedicated networks, and open networks, such as the Internet.

Still referring to FIG. 4, the pulse sequence server 510 functions in response to instructions downloaded from the operator workstation 502 to operate a gradient system 518 and an RF system 520. Gradient waveforms necessary to perform the prescribed scan are produced and applied to the gradient system 518, which excites gradient coils in an assembly 522 to produce the magnetic field gradients $G_x$, $G_y$, and $G_z$ used for position encoding magnetic resonance signals. A magnet assembly 524 comprises a gradient coil assembly 522, a polarizing magnet 526, and a whole-body RF coil 528.

Still referring to FIG. 4, RF waveforms are applied by the RF system 520 to the whole-body RF coil 528, or a separate local coil (not shown in FIG. 5), in order to perform the prescribed magnetic resonance pulse sequence. Responsive magnetic resonance signals detected by the whole-body RF coil 528, or a separate local coil (not shown in FIG. 5), are received by the RF system 520, wherein the responsive magnetic resonance signals are amplified, demodulated, filtered, and digitized under direction of commands produced by the pulse sequence server 510. The RF system 520 comprises an RF transmitter (not shown) for producing a wide variety of RF pulses used in MRI pulse sequences. The RF transmitter is responsive to the scan prescription and direction from the pulse sequence server 510 to produce RF pulses of a desired frequency, phase, and pulse amplitude waveform. The generated RF pulses are applied to the whole-body RF coil 528 or to one or more local coils or coil arrays (not shown in FIG. 5).

Still referring to FIG. 4, the RF system 520 further comprises one or more RF receiver channels (not shown). Each RF receiver channel comprises an RF preamplifier that preamplifies the magnetic resonance signal received by the whole-body RF coil 528 to which each such RF channel is connected, and a detector that detects and digitizes the I and Q quadrature components of the received magnetic resonance signal. The magnitude M of the received magnetic resonance signal, therefore, is determinable at any sampled point by the square root of the sum of the square of the I and the square of the Q components:

$$M = \sqrt{I^2 + Q^2}$$

and the phase φ of the received magnetic resonance signal is also determinable according to the following relationship:

$$\varphi = \tan^{-1}\left(\frac{Q}{I}\right)$$

Still referring to FIG. 4, the pulse sequence server 510 also optionally receives patient data from a physiological acquisition controller 530. By way of example, the physiological acquisition controller 530 receive signals from a number of different sensors coupled with the patient 103, such as electrocardiograph ("ECG") signals from electrodes or respiratory signals from at least one of a respiratory bellows and any other respiratory monitoring device. Such signals are typically used by the pulse sequence server 510 to synchronize, or "gate," the performance of the scan with the subject's heart beat or respiration. The pulse sequence server 510 is also coupled with a scan room interface circuit 532 that receives signals from various sensors associated with the condition of the patient 103 and the magnet assembly 524. A patient positioning system 534 receives commands to move the patient 103 to desired positions during the scan by way of the scan room interface circuit 532.

Still referring to FIG. 4, the digitized magnetic resonance signal samples produced by the RF system 520 are received by the data acquisition server 512. The data acquisition server 512 operates in response to instructions downloaded from the operator workstation 502 to receive the real-time MR data and to provide buffer storage, wherein data loss by data overrun is eliminated. In some scans, the data acquisition server 512 transmits the acquired MR data to the data processor server 514. However, in other scans that require other information, derived from acquired MR data, to control further performance of such other scans, the data acquisition server 512 is programmed to produce such other information and convey such other information to the pulse sequence server 510. For example, during pre-scans, MR data is acquired and used to calibrate the pulse sequence performed by the pulse sequence server 510. As another example, navigator signals are acquired and used to adjust the operating parameters of the RF system 520 or the gradient system 518, or to control the view order in which k-space is sampled. In still another example, the data acquisition server 512 is also employed to process MR signals that are used to detect the arrival of a contrast agent in a MR angiography ("MRA") scan. By way of example, the data acquisition server 512 acquires MR data and processes such MR data in real-time to produce information that is used to control the scan.

Still referring to FIG. 4, the data processing server 514 receives MR data from the data acquisition server 512 and processes the MR data in accordance with instructions downloaded from the operator workstation 502. Such processing, for example, comprises one or more of the following: reconstructing two-dimensional or three-dimensional images by performing a Fourier transformation of raw k-space data; performing other image reconstruction steps corresponding to reconstruction algorithms, such as iterative or back-projection reconstruction steps; applying filters to raw k-space data or to reconstructed images; generating functional magnetic resonance images; calculating motion or flow images; and so on.

Still referring to FIG. 4, images reconstructed by the data processing server 514 are conveyed back to the operator workstation 502 wherein the operator workstation 502 is configured to store the reconstructed images. Real-time images are stored in a database memory cache (not shown in FIG. 5), from which they may be output to operator display 512 or a display 536 that is located near the magnet assembly 524 for use by attending physicians. Batch-mode images or selected real-time images are stored in a host database on a disc storage 538. When such images have been reconstructed and transferred to storage, the data processing server 514 notifies the data store server 516 via the operator workstation 502. The operator workstation 502 is usable by an operator to at least one of: archive the images, produce films, and send the images via a network to other facilities.

Still referring to FIG. 4, the MRI system 500 may also include one or more networked workstations 542. By way of example, a networked workstation 542 may include a display 544; one or more input devices 546, such as a keyboard and mouse; and a processor 548. The networked workstation 542 may be located within the same facility as the operator workstation 502, or in a different facility, such as a different healthcare institution or clinic. The networked workstation 542, whether within the same facility or in a different facility as the operator workstation 502, may gain remote access to the data processing server 514 or data store server 516 via the communication system 540. Accordingly, multiple networked workstations 542 may have access to the data processing server 514 and the data store server 516. In this manner, magnetic resonance data, reconstructed images, or other data may be exchanged between the data processing server 514 or the data store server 516 and the networked workstations 542, such that the data or images may be remotely processed by a networked workstation 542. This data may be exchanged in any suitable format, such as in accordance with the transmission control protocol (TCP), the Internet protocol (IP), or other known or suitable protocols.

Figure 5:
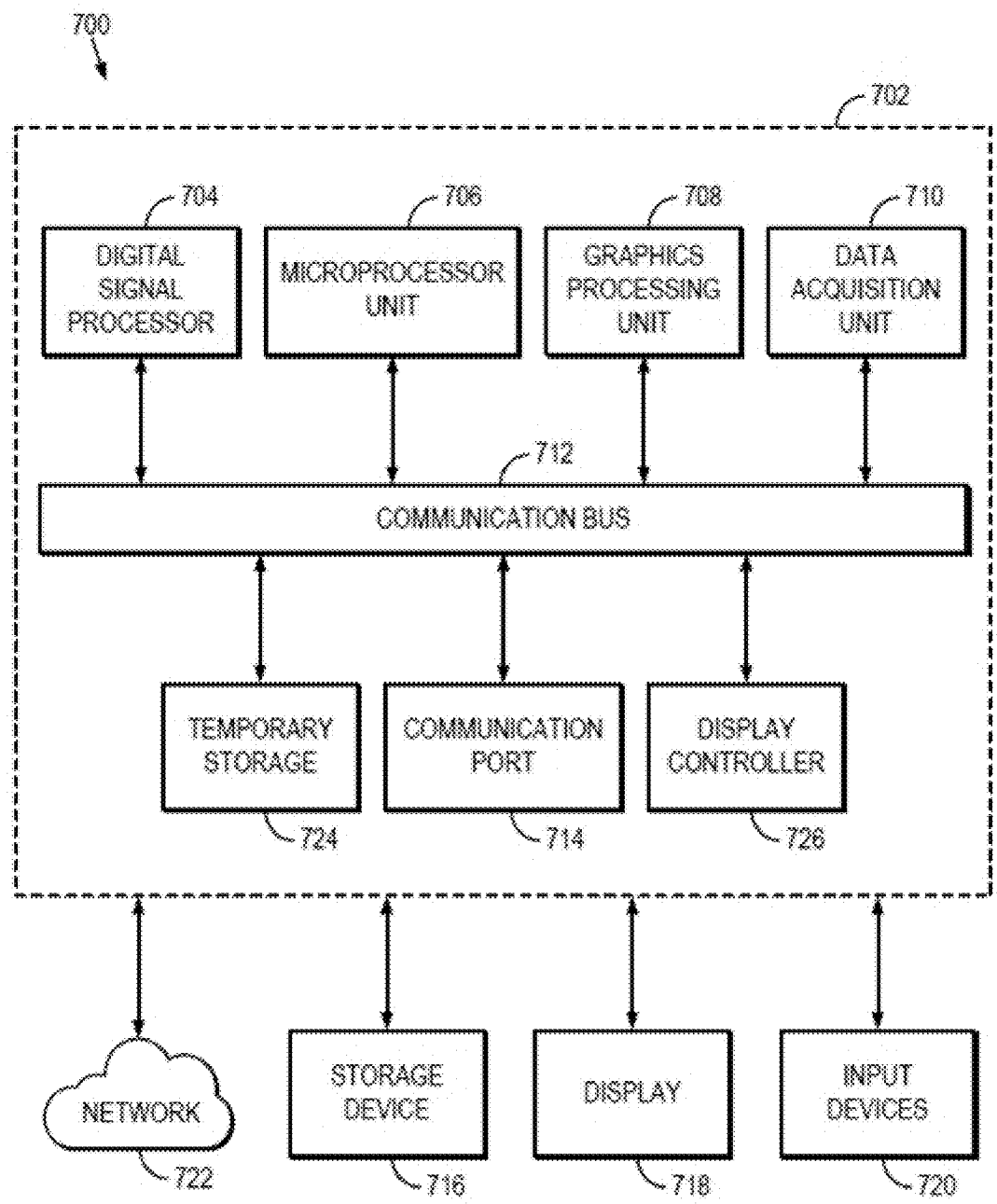
FIG. 5 is a block diagram illustrating a computer system configured to implement the methods described herein in relation to the MRI system, as shown in FIG. 4, in accordance with an embodiment of the present disclosure.

Referring to FIG. 5, this block diagram illustrates a computer system 700 configured to implement the methods herein described in relation to the MRI system 500, e.g., as shown in FIG. 4, in accordance with an embodiment of the present disclosure. The computer system 700 is configurable to co-register medical images acquired with different imaging modalities, as described. The medical images, to be co-registered, are providable to the computer system 700 from the respective medical imaging systems, such as the MRI system 500 and a CT system, e.g., via a network 522, or from a data storage device 716. These medical images are received in a processing unit 702.

Still referring to FIG. 5, in some embodiments, the processing unit 702 comprises one or more processors. As an example, the processing unit 702 comprises one or more of a digital signal processor ("DSP") 704, a microprocessor unit ("MPU") 706, and a graphics processing unit ("GPU") 708. The processing unit 702 comprises a data acquisition unit 710 that is configured to electronically receive data to be processed, which may include first and second medical images, image series, or image volumes. The DSP 704, MPU 706, GPU 708, and data acquisition unit 710 are all coupled with a communication bus 712. As an example, the communication bus 712 comprises a group of wires, or a hardwire, used for switching data between the peripherals, such as a network 722, a storage device 716, a display 718, and input devices 720, or between any component in the processing unit 702.

Still referring to FIG. 5, the DSP 704 is configurable to receive and processes the first and second medical images. The MPU 706 and GPU 708 are also configurable to process the first and second medical images in conjunction with the DSP 704. As an example, the MPU 706 is configurable to control the operation of components in the processing unit 702 and can include instructions to perform processing of the first and second medical images on the DSP 704. Also, as an example, the GPU 708 is configured to process image graphics. In some embodiments, the DSP 704 is configurable to process the first and second medical images received by the processing unit 702 in accordance with the above-described algorithms. Thus, the DSP 704 can be configured to identify anatomical features in the images, to calculate registration parameters based on the identified anatomical features and known spatial relationships therebetween, and to co-register the images using the registration parameters.

Still referring to FIG. 5, the processing unit 702 preferably comprises a communication port 714 in electronic communication with other devices, such as a storage device 716, a display 718, and one or more input devices 720. Examples of an input device 720 include, but are not limited to, a keyboard, a mouse, and a touch screen through which a user can provide an input. The storage device 716 is configured to store images, whether provided to or processed by the processing unit 702. The display 718 is used to display images, such as images that may be stored in the storage device 716, and other information. Thus, in some embodiments, the storage device 716 and the display 718 can be used for displaying the images before and after registration and for outputting other information, such as data plots or other reports based on the registration process. The processing unit 702 can also be in electronic communication with a network 722 to transmit and receive data, including CT images, MR images, and other information. The communication port 714 can also be coupled to the processing unit 702 through a switched central resource, for example the communication bus 712. The processing unit 702 further comprises a temporary storage 724 and a display controller 726. As an example, the temporary storage 724 is configured to store temporary information. For instance, the temporary storage 724 comprises a random-access memory (RAM).

Referring to FIGS. 6A-6D, together, these diagrams illustrate cross-sectional views, and corresponding perspective views, of at least one wire winding 1100 of a gradient coil apparatus A, embedded in a former, for magnetic resonance imaging, wherein the at least one winding 1100 is implementable as part of a distributed set of windings disposable on a tube, in accordance with an embodiment of the present disclosure. The gradient coil apparatus A comprises at least one wire winding 1100, e.g., around an apparatus body B, the at least one wire winding 1100 comprising at least one hollow cross-section wire 1101 and at least one solid cross-section wire 1102, and the at least one solid cross-section 1102 wire disposed in one of adjacent and proximate the at least one hollow cross-section wire 1101, wherein the apparatus body B comprises one of a former, a tube, and any other support structure, and whereby at least one of current density, winding density, and heat extraction are increasable.

Still referring to FIGS. 6A-6H, in the gradient coil apparatus A, the at least one wire winding 1100 is configured as a Z-gradient coil, by example only. The at least one solid cross-section wire 1102 comprises a cross-sectional area less than that of the at least one hollow cross-section wire 1101, by example only. Each at least one solid cross-section wire 1102 is disposed in one of adjacent and proximate to two hollow cross-section wires 1101 at any radial position, by example only. By example only, two solid cross-section wires 1102 are disposed in one of adjacent and proximate each at least one hollow cross-section wire 1101 at any radial position, by example only. Disposing the at least one solid cross-section 1102 wire disposed in one of adjacent and proximate the at least one hollow cross-section wire 1101 and disposing an electrically insulating thermally transfer-ring layer 1110 therebetween facilitates electrical separation between the hollow wire 1101 and the solid cross-section wire 1102, but also facilities heat transfer, wherein the electrically insulating thermally transferring layer 1110 comprises at least one of a polyimide film, an enamel coating, an epoxy layer, or any other suitable electrically insulating material whereby heat transfer for cooling the gradient coil apparatus A is facilitated. The winding 1100 may be integrally or separately formed in relation to the former or forming apparatus B.

Figure 6A:
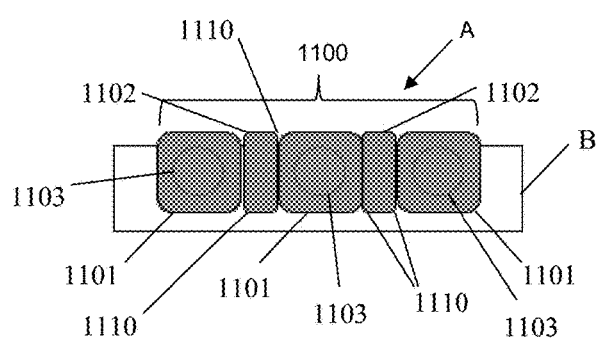
FIG. 6A is a diagram illustrating a cross-sectional view of at least one wire winding of a gradient coil apparatus for MRI, embedded in a former or forming apparatus, the at least one wire winding comprising at least one hollow cross-section wire and at least one solid cross-section wire, and the at least one solid cross-section wire disposed in one of adjacent and proximate the at least one hollow cross-section wire, in accordance with an embodiment of the present disclosure.

Referring to FIG. 6A, this diagram illustrates a cross-sectional view of at least one wire winding 1100 of the gradient coil apparatus A, embedded in a former or forming apparatus B, the at least one wire winding 1100 comprising at least one hollow cross-section wire 1101 and at least one solid cross-section wire 1102, and the at least one solid cross-section 1102 wire disposed in one of adjacent and proximate to the at least one hollow cross-section wire 1101, wherein each at least one solid cross-section wire 1102 is disposed between two hollow cross-section wires 1101, and wherein the at least one winding 1100 is implementable as part of a distributed set of windings disposable on a tube, by example only, in accordance with an embodiment of the present disclosure. The electrically insulating thermally transferring layer 1110 is disposable between the at least one solid cross-section 1102 wire and the at least one hollow cross-section wire 1101. Each at least one hollow cross-section wire 1101 has a channel 1103 for accommodating coolant flow. Alternatively, the solid cross-section wires 1102 are disposed at radial positions that are distinct from radial positions of the hollow cross-section wires 1101.

Figure 6B:
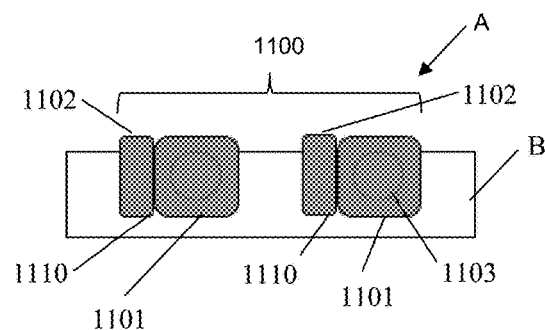
FIG. 6B is a diagram illustrating a cross-sectional view of at least one wire winding of a gradient coil apparatus for MRI, embedded in a former or forming apparatus, the at least one wire winding comprising at least one hollow cross-section wire and at least one solid cross-section wire, and the at least one solid cross-section wire disposed in one of adjacent and proximate the at least one hollow cross-section wire, in accordance with an embodiment of the present disclosure.

Referring to FIG. 6B, this diagram illustrates a cross-sectional view of at least one wire winding 1100 of the gradient coil apparatus A, embedded in a former or forming apparatus B, the at least one wire winding 1100 comprising at least one hollow cross-section wire 1101 and at least one solid cross-section wire 1102, and the at least one solid cross-section 1102 wire disposed in one of adjacent and proximate the at least one hollow cross-section wire 1101, wherein each at least one solid cross-section wire 1102 is laterally disposed in one of adjacent and proximate each at least one hollow cross-section wire 1101, and wherein the at least one winding 1100 is implementable as part of a distributed set of windings disposable on a tube, by example only, in accordance with an embodiment of the present disclosure. The electrically insulating thermally transferring layer 1110 is disposable between the at least one solid cross-section 1102 wire and the at least one hollow cross-section wire 1101. Each at least one hollow cross-section wire 1101 has a channel 1103 for accommodating coolant flow. Alternatively, the solid cross-section wires 1102 are disposed at radial positions that are distinct from radial positions of the hollow cross-section wires 1101.

Figure 6C:
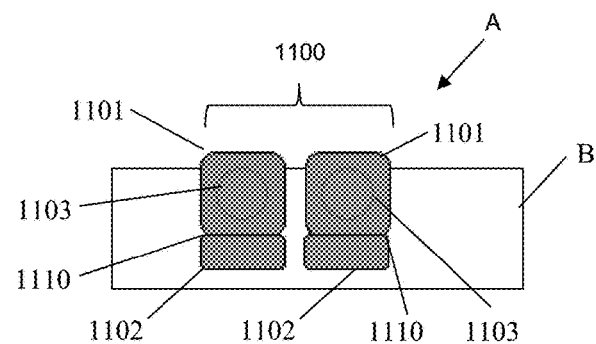
FIG. 6C is a diagram illustrating a cross-sectional perspective view of at least one wire winding of a gradient coil apparatus for MRI, as shown in FIG. 6A, embedded in a former or forming apparatus, the at least one wire winding comprising at least one hollow cross-section wire and at least one solid cross-section wire, and the at least one solid cross-section wire disposed in one of adjacent and proximate the at least one hollow cross-section wire, in accordance with an embodiment of the present disclosure.

Referring to FIG. 6C, this diagram illustrates a cross-sectional perspective view of at least one wire winding 1100 of the gradient coil apparatus A, as shown in FIG. 6A, embedded in a former or forming apparatus B, the at least one wire winding 1100 comprising at least one hollow cross-section wire 1101 and at least one solid cross-section wire 1102, and the at least one solid cross-section 1102 wire disposed in one of adjacent and proximate the at least one hollow cross-section wire 1101, wherein each at least one solid cross-section wire 1102 is disposed between two hollow cross-section wires 1101, and wherein the at least one winding 1100 is implementable as part of a distributed set of windings disposable on a tube, by example only, in accordance with an embodiment of the present disclosure. The electrically insulating thermally transferring layer 1110 is disposable between the at least one solid cross-section 1102 wire and the at least one hollow cross-section wire 1101. The electrically insulating thermally transferring layer 1110 is disposable between the at least one solid cross-section 1102 wire and the at least one hollow cross-section wire 1101. Each at least one hollow cross-section wire 1101 has a channel 1103 for accommodating coolant flow. Alternatively, the solid cross-section wires 1102 are disposed at radial positions that are distinct from radial positions of the hollow cross-section wires 1101.

Figure 6D:
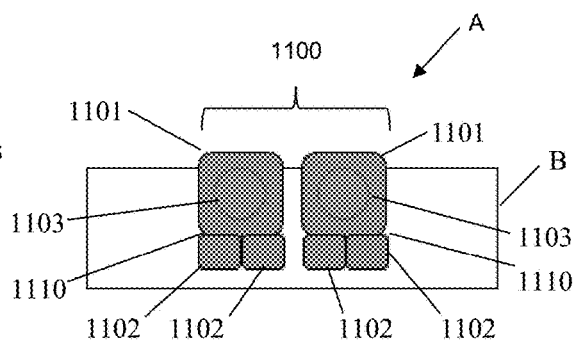
FIG. 6D is a diagram illustrating a cross-sectional perspective view of at least one wire winding of a gradient coil apparatus for MRI, as shown in FIG. 6B, embedded in a former or forming apparatus, the at least one wire winding comprising at least one hollow cross-section wire and at least one solid cross-section wire, and the at least one solid cross-section wire disposed in one of adjacent and proximate the at least one hollow cross-section wire, in accordance with an embodiment of the present disclosure.

Referring to FIG. 6D, this diagram illustrates a cross-sectional perspective view of at least one wire winding 1100 of the gradient coil apparatus A, as shown in FIG. 6B, embedded in a former or forming apparatus B, the at least one wire winding 1100 comprising at least one hollow cross-section wire 1101 and at least one solid cross-section wire 1102, and the at least one solid cross-section 1102 wire disposed in one of adjacent and proximate the at least one hollow cross-section wire 1101, wherein each at least one solid cross-section wire 1102 is laterally disposed in one of adjacent and proximate each at least one hollow cross-section wire 1101, and wherein the at least one winding 1100 is implementable as part of a distributed set of windings disposable on a tube, by example only, in accordance with an embodiment of the present disclosure. The electrically insulating thermally transferring layer 1110 is disposable between the at least one solid cross-section 1102 wire and the at least one hollow cross-section wire 1101. Each at least one hollow cross-section wire 1101 has a channel 1103 for accommodating coolant flow. Alternatively, the solid cross-section wires 1102 are disposed at radial positions that are distinct from radial positions of the hollow cross-section wires 1101.

Figure 6E:
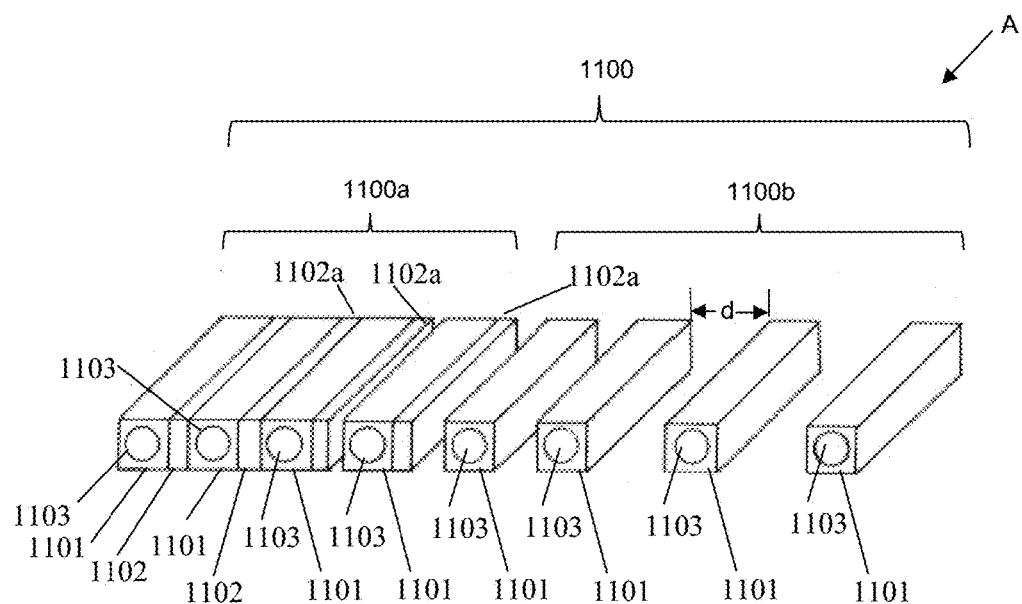
FIG. 6E is a diagram illustrating a cross-sectional perspective view of at least one wire winding of a gradient coil apparatus for MRI, the at least one wire winding comprising at least one hollow cross-section wire and at least one solid cross-section wire, a portion of the at least one wire winding comprising the at least one solid cross-section wire disposed in one of adjacent and proximate the at least one hollow cross-section wire, and another portion of the at least one winding comprising the at least one hollow cross-section wire being spaced apart, in accordance with an embodiment of the present disclosure.

Referring to FIG. 6E, this diagram illustrates, in a cross-sectional perspective view, a winding of a gradient coil apparatus A for MRI, comprising at least one wire winding 1100, the at least one wire winding 1100 comprising at least one hollow cross-section wire 1101 and at least one solid cross-section wire 1102, wherein a portion 1100a of the at least one winding 1100 comprises the at least one solid cross-section wire 1102 disposed in one of adjacent and proximate the at least one hollow cross-section wire 1101 to generate a high current density region, e.g., wherein the high current density is greater than a current density that is achievable with a hollow large cross-sectional wire alone, wherein each at least one solid cross-section wire 1102 comprises a cross-sectional area less than that of the at least one hollow cross-section wire 1101, and wherein another portion 1100b of the at least one winding 1100 comprises the at least one hollow cross-section wire 1101 being spaced apart, e.g., by a distance d, to generate a high current density region, e.g., wherein the high current density is greater than a current density that is achievable with a hollow large cross-sectional wire alone (having a cross-sectional area larger than that of the at least one solid cross-section wire 1102, by example only, in accordance with an embodiment of the present disclosure. The electrically insulating thermally transferring layer 1110 is disposable between the at least one solid cross-section 1102 wire and the at least one hollow cross-section wire 1101. An example configuration of the at least one winding 1100 comprises approximately 1 turn/cm to approximately 20 turns/cm.

Figure 6F:
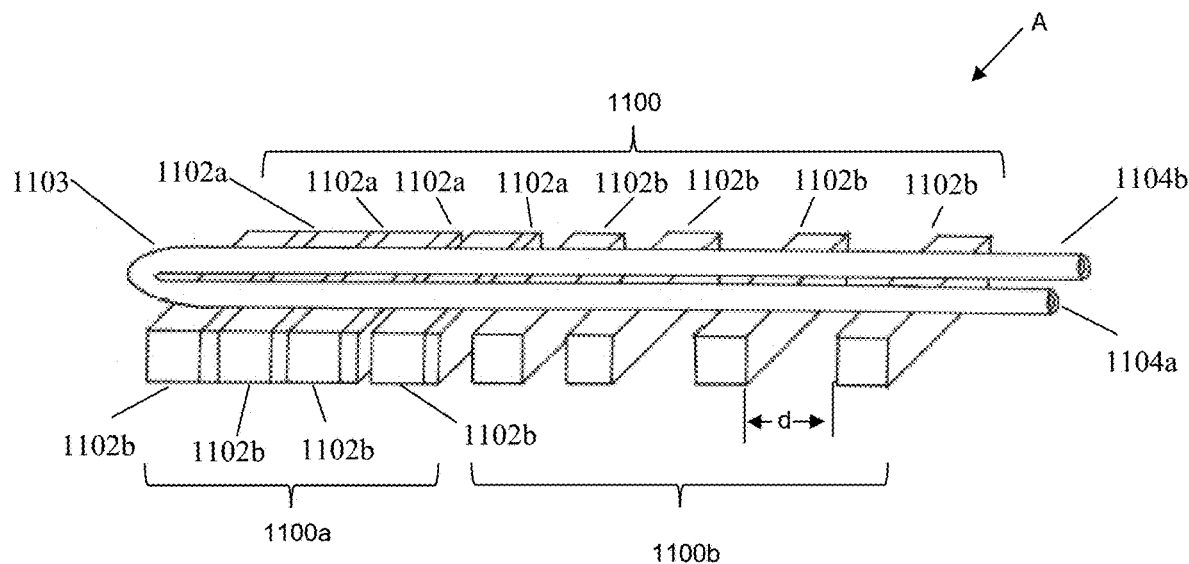
FIG. 6F is a diagram illustrating a cross-sectional perspective view of at least one wire winding of a gradient coil apparatus for MRI, the at least one wire winding comprising at least one solid small cross-section wire and at least one thick large cross-section wire, a portion of the at least one winding comprising the at least one thin small cross-section wire disposed in one of adjacent and proximate the at least one solid large cross-section wire, and another portion of the at least one winding comprising the at least one solid large cross-section wire being spaced apart; and at least one cooling element, in accordance with an embodiment of the present disclosure.

Referring to FIG. 6F, this diagram illustrates, in a cross-sectional perspective view, a winding of a gradient coil apparatus A for MRI, comprising: at least one wire winding 1100, the at least one wire winding 1100 comprising at least one solid small cross-section wire 1102a, e.g., comprising a first width in a range of approximately 1 mm to approximately 10 mm, by example only, and at least one solid large cross-section wire 1102b, e.g., comprising a second width in a range of approximately 3 mm to approximately 20 mm, by example only, wherein a portion 1100a of the at least one winding 1100 comprises the at least one solid small cross-section wire 1102a disposed in one of adjacent and proximate the at least one solid large cross-section wire 1102b, and wherein another portion 1100b of the at least one winding 1100 comprises the at least one solid large cross-section wire 1102b being spaced apart, e.g., by a distance d, wherein the distance d is generally variable from one solid large cross-section wire 1102b to another solid large cross-section wire 1102b in the portion 1100b; and at least one cooling element 1104, the at least one cooling element 1104 comprising a tubing structure disposed in one of adjacent and proximate the at least one winding for accommodating flow of a coolant material, by example only, in accordance with an embodiment of the present disclosure. In this embodiment, at least one solid small cross-section wire 1102a effects a high winding density; and at least one solid large cross-section wire 1102b effects a lower winding density. The electrically insulating thermally transferring layer 1110 (FIGS. 6A-6D) is disposable between the at least one solid cross-section 1102 wire and the at least one hollow cross-section wire 1101. In this configuration, a high current density region is generated, e.g., wherein the high current density is greater than a current density that is achievable with a solid large cross-sectional wire alone. Alternatively, a thin wire or a small cross-section wire is interleaved with a wide wire or a large cross-section wire (large cross-section size being relative to the small cross-section size), wherein the large cross-section wire is used in a larger portion of the at least one winding 1100, and wherein the a small cross-section wire is interleaved with the large cross-section wire in another portion of the at least one winding 1100 where a high current density is required.

Figure 6G:
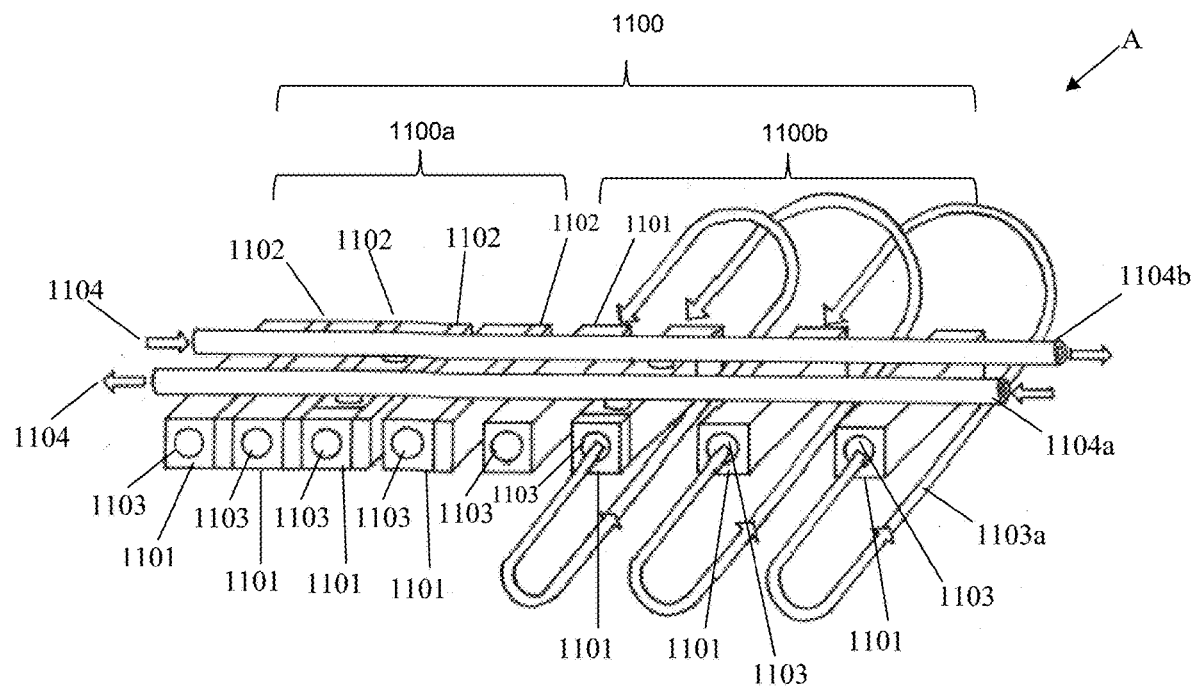
FIG. 6G is a diagram illustrating a cross-sectional perspective view of at least one wire winding of a gradient coil apparatus for MRI, the at least one wire winding comprising at least one hollow cross-section wire and at least one solid cross-section wire, a portion of the at least one winding comprising the at least one solid cross-section wire disposed in one of adjacent and proximate the at least one hollow cross-section wire, and another portion of the at least one winding comprising the at least one hollow cross-section wire being spaced apart; and at least one cooling element, in accordance with an embodiment of the present disclosure.

Referring to FIG. 6G, this diagram illustrates, in a cross-sectional perspective view, a winding of a gradient coil apparatus A for MRI, comprising: at least one wire winding 1100, the at least one wire winding 1100 comprising at least one hollow cross-section wire 1101 and at least one solid cross-section wire 1102, wherein a portion 1100a of the at least one winding 1100 comprises the at least one solid cross-section wire 1102 disposed in one of adjacent and proximate the at least one hollow cross-section wire 1101 to generate a high current density region, e.g., wherein the high current density is greater than a current density that is achievable with a hollow large cross-sectional wire alone, wherein each at least one solid cross-section wire 1102 is small cross-section or thin in width, e.g., comprising a width in a range of approximately 1 mm to approximately 10 mm, by example only, and wherein another portion 1100b of the at least one winding 1100 comprises the at least one hollow cross-section wire 1101 being spaced apart, e.g., by a distance d, to generate a low current density region, e.g., wherein the low current density is less than 3 turns per centimeter, by example only; and at least one cooling element 1104, the at least one cooling element 1104 comprising at least one tubing structure, e.g., a coolant supply line 1104a and a coolant return line 1104b, disposed in one of adjacent and proximate the at least one winding 1100 for accommodating flow of a coolant material, wherein by example only, in accordance with an embodiment of the present disclosure. Each at least one hollow cross-section wire 1101 has a channel 1103 for accommodating coolant flow, the channel 1103 in fluid communication with the at least one cooling element 1104, e.g., via at least one cooling manifold 1105. The at least one cooling manifold 1105 is insertable into the at least one hollow cross-section wire 1101, e.g., through at least one through-hole (not shown), and is configured to effect parallel coolant flow paths 1103a, whereby overall flow resistance is reduced and cooling is improved. The electrically insulating thermally transferring layer 1110 (FIGS. 6A-6D) is disposable between the at least one solid cross-section 1102 wire and the at least one hollow cross-section wire 1101.

Figure 6H:
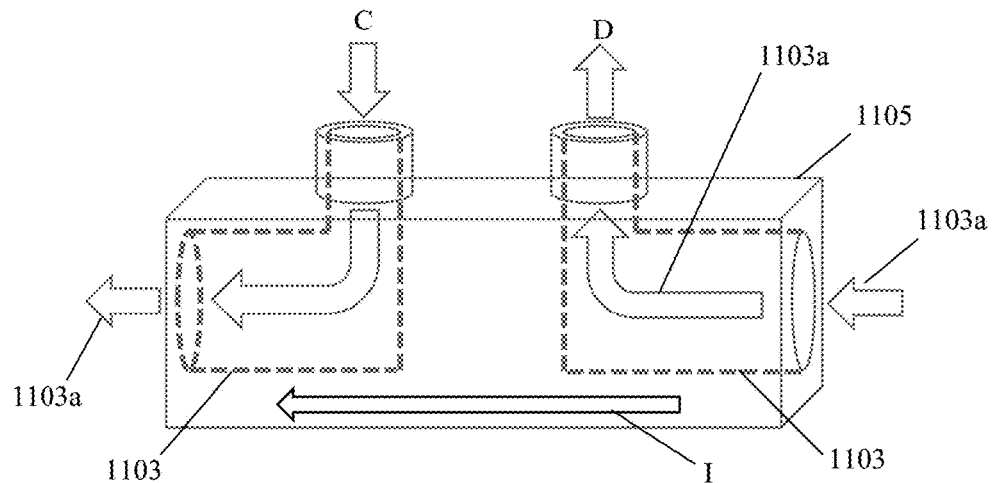
FIG. 6H is a diagram illustrating a perspective view of the at least one cooling manifold insertable into the at least one hollow cross-section wire and are configured to effect parallel coolant flow paths, as shown in FIG. 6G, in accordance with an embodiment of the present disclosure.

FIG. 6H is a diagram illustrating a perspective view of at least one cooling manifold 1105, as shown in FIG. 6G, in accordance with an embodiment of the present disclosure. The at least one hollow cross-section wire 1101 conducts an electrical current in a direction I. Further, the electrical current can also be generated to conduct in a direction that is opposite to the direction I. By example only, coolant (not shown) is provided from the coolant supply line 1104a to the at least one hollow cross-section wire 1101 via the cooling manifold 1105 in direction C; and coolant is returned from the at least one hollow cross-section wire 1101 to the coolant return line 1104b via the cooling manifold 1105 in a direction D. The at least one cooling manifold 1105 is disposable around the at least one hollow cross-section wire 1101 and insertable into both the at least one hollow cross-section wire 1101 and the cooling element 1104. Alternatively, the cooling manifold 1105 comprises a separate component configured to couple with at least one cross-sectional end of the at least one hollow cross-section wire 1101. The cooling manifold 1105 further comprises any features disclosed in Handler et al., "New Head Gradient Coil Design and Construction Techniques," J. of Magnetic Resonance Imaging, V. 39, pp. 1088-1095 (2013), hereby incorporated by reference herein in its entirety.

Figure 7:
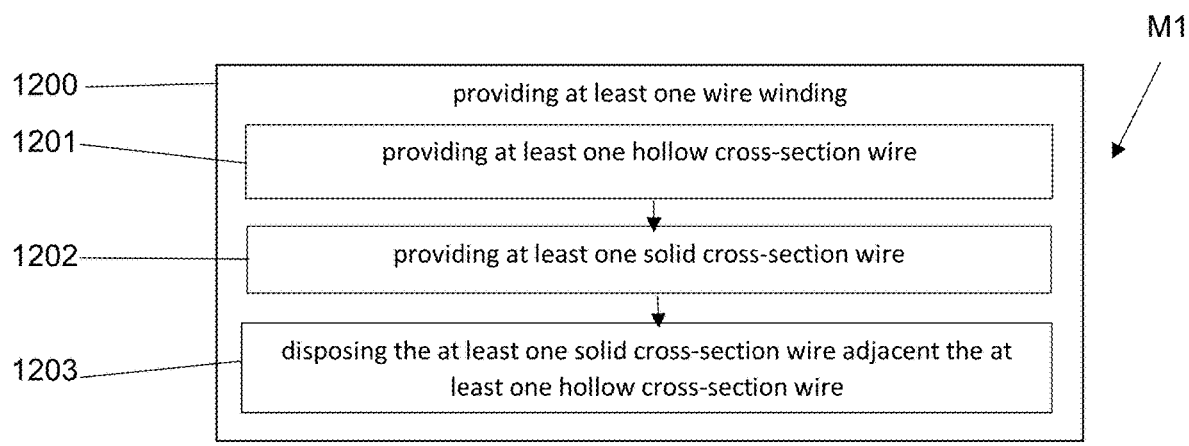
FIG. 7 is a flow diagram illustrating a method of fabricating a gradient coil apparatus for MRI, in accordance with an embodiment of the present disclosure.

Referring to FIG. 7, this flow diagram illustrates a method M1 of fabricating a gradient coil apparatus A for magnetic resonance imaging, in accordance with an embodiment of the present disclosure. The method the M1 comprises: providing at least one wire winding 1100, as indicated by block 1200, providing the at least one wire winding 1100 comprising: providing at least one hollow cross-section wire 1101, as indicated by block 1201; providing at least one solid cross-section wire 1102, as indicated by block 1202; and disposing the at least one solid cross-section wire 1102 in one of adjacent and proximate the at least one hollow cross-section wire 1101, as indicated by block 1203, whereby at least one of current density, winding density, and heat extraction are increasable.

Still referring to FIG. 7, in the fabrication method M1, providing the at least one wire winding 1100, as indicated by block 1200, comprises configuring the at least one wire winding 1100 as a Z-gradient coil. Providing the at least one solid cross-section wire, as indicated by block 1202, comprises providing the at least one solid cross-section wire 1102 with a cross-sectional area less than that of the at least one hollow cross-section wire 1101. Providing the at least one solid cross-section wire 1102, as indicated by block 1202, comprises disposing each at least one solid cross-section wire 1102 in one of adjacent and proximate to two hollow cross-section wires 1101 at any radial position. Providing the at least one solid cross-section wire 1102, as indicated by block 1202, comprises disposing two solid cross-section wires 1102 in one of adjacent and proximate each at least one hollow cross-section wire 1101 at any radial position.

Figure 8:
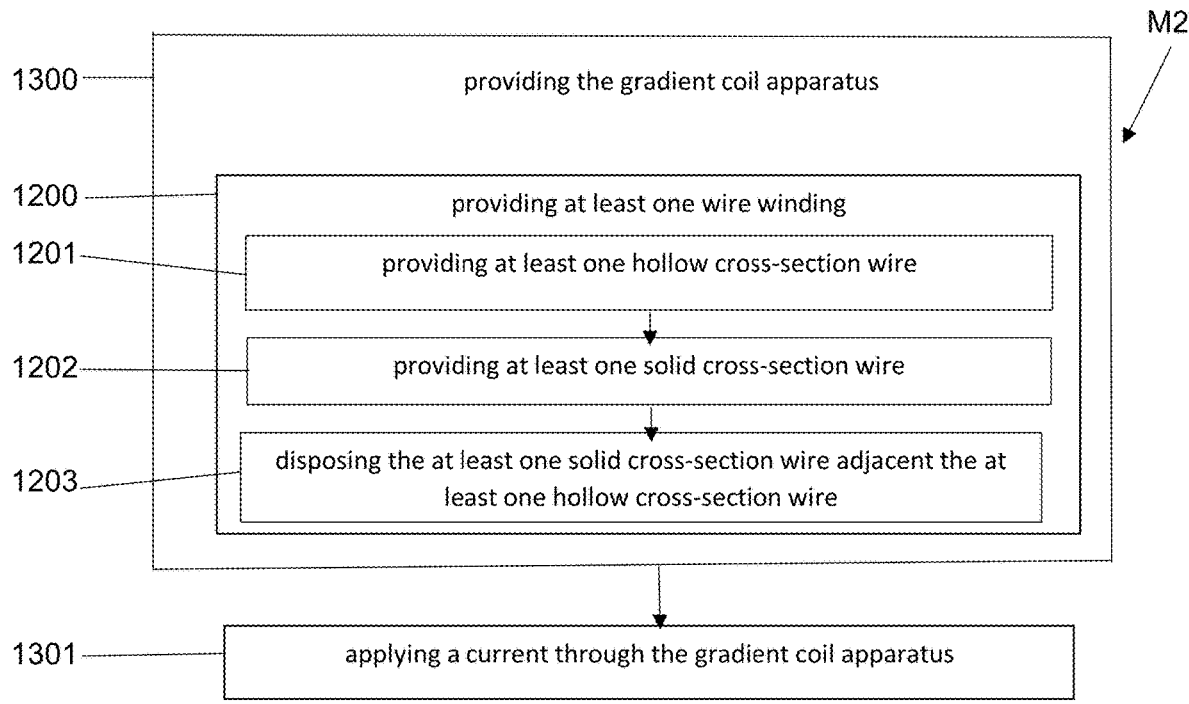
FIG. 8 is a flow diagram illustrating a method of increasing at least one of current density, winding density, and heat extraction for magnetic resonance imaging, by way of a gradient coil apparatus, in accordance with an embodiment of the present disclosure.

Referring to FIG. 8, this flow diagram illustrates a method M2 of increasing at least one of current density, winding density, and heat extraction for magnetic resonance imaging by way of a gradient coil apparatus A, in accordance with an embodiment of the present disclosure. The method M2 comprises: providing the gradient coil apparatus A, as indicated by block 1300, providing the apparatus A comprising providing at least one wire winding 1100, as indicated by block 1200, providing the at least one wire winding 1100 comprising: providing at least one hollow cross-section wire 1101, as indicated by block 1201; providing at least one solid cross-section wire 1102, as indicated by block 1202; and disposing the at least one solid cross-section wire 1102 in one of adjacent and proximate the at least one hollow cross-section wire 1101, as indicated by block 1103, whereby at least one of current density, winding density, and heat extraction are increasable; and applying a current through the gradient coil apparatus A, as indicated by block 1301, thereby increasing at least one of current density, winding density, and heat extraction.

Still referring to FIG. 8, in the fabrication method M2, providing the at least one wire winding 1100, as indicated by block 1200, comprises configuring the at least one wire winding 1100 as a Z-gradient coil. Providing the at least one solid cross-section wire, as indicated by block 1202, comprises providing the at least one solid cross-section wire 1102 with a width less than that of the at least one hollow cross-section wire 1101. Providing the at least one solid cross-section wire 1102, as indicated by block 1202, comprises disposing each at least one solid cross-section wire 1102 in one of adjacent and proximate to two hollow cross-section wires 1101 at any radial position. Providing the at least one solid cross-section wire 1102, as indicated by block 1202, comprises disposing a plurality of solid cross-section wires 1102 in one of adjacent and proximate each at least one hollow cross-section wire 1101 at any radial position.

Information, as herein shown and described in detail, is fully capable of attaining the above-described embodiments of the present disclosure as well as the presently preferred embodiment(s) of the present disclosure, and is, thus, representative of the subject matter which is broadly contemplated by the present disclosure. The scope of the present disclosure fully encompasses other embodiments; and the scope of the claims is to be limited by nothing other than the appended claims, wherein any reference to an element being made in the singular is not intended to mean "one and only one" unless explicitly so stated, but rather "one or more." All structural and functional equivalents to the elements of the above-described preferred embodiment and additional embodiments as regarded by those of ordinary skill in the art are hereby expressly incorporated by reference and are intended to be encompassed by the present claims.

Moreover, no requirement exists for a system or method to address each and every problem sought to be resolved by the present disclosure, for such to be encompassed by the present claims. Furthermore, no element, component, or method step in the present disclosure is intended to be dedicated to the public, regardless of whether the element, component, or method step is explicitly recited in the claims. However, various changes and modifications in form, material, work-piece, and fabrication material detail may be made, without departing from the spirit and scope of the present disclosure, as set forth in the appended claims, are also encompassed by the present disclosure.

What is claimed:

1. A coil apparatus for magnetic resonance imaging, comprising:
at least one wire winding,
the at least one wire winding comprising at least one hollow cross-section wire and at least one solid cross-section wire,
the at least one solid cross-section wire disposed adjacent and proximate to the at least one hollow cross-section wire,
the at least one solid cross-section wire directed parallel to the at least one hollow cross-section wire along the path of the at least one wire winding,
the at least one wire winding configured to carry electrical current such that each of the at least one solid cross-section wire and each of the at least one hollow cross-section wire are electrically connected in series with each other and convey simultaneously the same electrical current,
an electrical power supply configured to drive electrical current through the at least one wire winding,
a liquid cooling source configured to flow liquid coolant through the at least one hollow cross-section wire continuously, and
whereby at least one of current density, winding density, and heat extraction are increasable,
wherein the at least one hollow cross-section wire comprises a plurality of hollow cross-section wires,
wherein the plurality of hollow cross-section wires comprises a set of hollow cross-section wires,
wherein each hollow cross-section wire of the set comprises a plurality of parallel manifolds for increasing total coolant flow rate, for a given pressure drop across the set, wherein heat extraction is increasable,
wherein the plurality of parallel manifolds facilitates electrical current flow from the set to one of an adjacent set and a proximate set of hollow cross-section wires,
wherein the plurality of parallel manifolds directs coolant flow in relation to a winding segment, and
wherein each parallel manifold of the plurality of parallel manifolds is configured to insert into each at least one hollow cross-section wire via a through-hole and to effect parallel coolant flow paths to reduce overall flow resistance and to improve cooling.

2. The apparatus of claim 1, wherein at least one of:
the at least one solid cross-section wire comprises at least one solid small cross-section wire and at least one solid large cross-section wire,
the at least one solid large cross-section wire comprises a cross-section area greater than that of the at least one solid small cross-section wire,
the at least one solid small cross-section wire disposed in one of adjacent and proximate at least one of the at least one hollow cross-section wire and the at least one solid large cross-section wire,
the at least one wire winding comprises at least one portion, one portion comprising at least one of the at least one hollow cross-section wire and the at least one solid small cross-section wire, and another portion comprising at least one of the at least one hollow cross-section wire being spaced apart and the at least one solid small cross-section wire being spaced apart, and
the at least one wire winding is configured as one of a Z-gradient coil, a uniform field coil, and a Bd offset coil.

3. The apparatus of claim 1, wherein the at least one solid cross-section wire comprises a width less than that of the at least one hollow cross-section wire.

4. The apparatus of claim 1, wherein each at least one solid cross-section wire is disposed in one of adjacent and proximate two hollow cross-section wires.

5. The apparatus of claim 1, wherein a plurality of solid cross-section wires are disposed in one of adjacent and proximate each at least one hollow cross-section wire.

6. The apparatus of claim 1,
wherein the at least one wire winding is configured as a Z-gradient coil,
wherein the at least one solid cross-section wire comprises a cross-sectional area less than that of the at least one hollow cross-section wire, and
wherein one of: each at least one solid cross-section wire is disposed in one of adjacent and proximate two hollow cross-section wires, and two solid cross-section wires are disposed in one of adjacent and proximate each at least one hollow cross-section wire.

7. The apparatus of claim 1, further comprising an electrically insulating thermally transferring layer disposed in at least one of: between at least a portion of the at least one solid cross-section wire and at least a portion of the at least one hollow cross-section wire, on at least a portion of the at least one solid cross-section wire, and on at least a portion of the at least one hollow cross-section wire,
wherein the electrically insulating thermally transferring layer facilitates electrical separation between the at least one hollow wire and the at least one solid cross-section wire,
wherein the electrically insulating thermally transferring layer facilities heat transfer, and
wherein the electrically insulating thermally transferring layer comprises at least one of a polyimide film, an enamel coating, a thermally conductive enamel coating, an epoxy layer, a thermally conductive epoxy layer, and any other suitable electrically insulating material,
whereby heat transfer for cooling apparatus is facilitated.

8. A method of fabricating a coil apparatus for magnetic resonance imaging, comprising:
providing at least one wire winding,
providing the at least one wire winding comprising providing at least one hollow cross-section wire and at least one solid cross-section wire,
providing the at least one solid cross-section wire disposed adjacent and proximate to the at least one hollow cross-section wire,
providing the at least one solid cross-section wire directed parallel to the at least one hollow cross-section wire along the path of the at least one wire winding,
providing the at least one wire winding configured to carry electrical current such that each of the at least one solid cross-section wire and each of the at least one hollow cross-section wire are electrically connected in series with each other and convey simultaneously the same electrical current,
providing an electrical power supply configured to drive electrical current through the at least one wire winding,
providing a liquid cooling source configured to flow liquid coolant through the at least one hollow cross-section wire continuously, and
whereby at least one of current density, winding density, and heat extraction are increasable,
wherein the at least one hollow cross-section wire comprises a plurality of hollow cross-section wires,
wherein the plurality of hollow cross-section wires comprises a set of hollow cross-section wires,
wherein each hollow cross-section wire of the set comprises a plurality of parallel manifolds for increasing total coolant flow rate, for a given pressure drop across the set, wherein heat extraction is increasable,
wherein the plurality of parallel manifolds facilitates electrical current flow from the set to one of an adjacent set and a proximate set of hollow cross-section wires,
wherein the plurality of parallel manifolds directs coolant flow in relation to a winding segment, and
wherein each parallel manifold of the plurality of parallel manifolds is configured to insert into each at least one hollow cross-section wire via a through-hole and to effect parallel coolant flow paths to reduce overall flow resistance and to improve cooling.

9. The method of claim 8, wherein at least one of:
providing the at least one solid cross-section wire comprises providing at least one solid small cross-section wire and at least one solid large cross-section wire,
providing the at least one solid large cross-section wire comprises providing a cross-section area greater than that of the at least one solid small cross-section wire,
providing the at least one solid small cross-section wire comprises disposing the at least one solid small cross-section wire in one of adjacent and proximate at least one of the at least one hollow cross-section wire and the at least one solid large cross-section wire,
providing the at least one wire winding comprises providing at least one portion, providing the at least one portion comprising providing one portion as at least one of the at least one hollow cross-section wire and the at least one solid small cross-section wire, and providing the at least one portion comprising providing another portion as at least one of the at least one hollow cross-section wire being spaced apart and the at least one solid small cross-section wire being spaced apart, and
providing the at least one wire winding comprises configuring the at least one wire winding as one of a Z-gradient coil, a uniform field coil, and a $B_0$ offset coil.

10. The method of claim 8, wherein providing the at least one solid cross-section wire comprises providing the at least one solid cross-section wire with a width less than that of the at least one hollow cross-section wire.

11. The method of claim 8, wherein providing the at least one solid cross-section wire comprises disposing each at least one solid cross-section wire in one of adjacent and proximate two hollow cross-section wires.

12. The method of claim 8, wherein providing the at least one solid cross-section wire comprises disposing a plurality of solid cross-section wires in one of adjacent and proximate each at least one hollow cross-section wire.

13. The method of claim 8,
wherein providing the at least one wire winding comprises configuring the at least one wire winding as a Z-gradient coil,
wherein providing the at least one solid cross-section wire comprises providing the at least one solid cross-section wire with a cross-sectional area less than that of the at least one hollow cross-section wire, and
wherein of one: providing the at least one solid cross-section wire comprises disposing each at least one solid cross-section wire in one of adjacent and proximate two hollow cross-section wires, and providing the at least one solid cross-section wire comprises disposing two solid cross-section wires in one of adjacent and proximate each at least one hollow cross-section wire.

14. A method of increasing at least one of current density, winding density, and heat extraction for magnetic resonance imaging by way of a coil apparatus, comprising:
providing the coil apparatus,
providing the apparatus comprising providing at least one wire winding,
providing the at least one wire winding comprising providing at least one hollow cross-section wire and at least one solid cross-section wire,
providing the at least one solid cross-section wire disposed adjacent and proximate to the at least one hollow cross-section wire,
providing the at least one solid cross-section wire directed parallel to the at least one hollow cross-section wire along the path of the at least one wire winding,
providing the at least one wire winding configured to carry electrical current such that each of the at least one solid cross-section wire and each of the at least one hollow cross-section wire are electrically connected in series with each other and convey simultaneously the same electrical current,
providing an electrical power supply configured to drive electrical current through the at least one wire winding,
providing a liquid cooling source configured to flow liquid coolant through the at least one hollow cross-section wire continuously, and
applying a current through the gradient coil apparatus, thereby increasing at least one of current density, winding density, and heat extraction,
wherein the at least one hollow cross-section wire comprises a plurality of hollow cross-section wires,
wherein the plurality of hollow cross-section wires comprises a set of hollow cross-section wires,
wherein each hollow cross-section wire of the set comprises a plurality of parallel manifolds for increasing total coolant flow rate, for a given pressure drop across the set, wherein heat extraction is increasable,
wherein the plurality of parallel manifolds facilitates electrical current flow from the set to one of an adjacent set and a proximate set of hollow cross-section wires,
wherein the plurality of parallel manifolds directs coolant flow in relation to a winding segment, and
wherein each parallel manifold of the plurality of parallel manifolds is configured to insert into each at least one hollow cross-section wire via a through-hole and to effect parallel coolant flow paths to reduce overall flow resistance and to improve cooling.

15. The method of claim 14, wherein at least one of:
providing the at least one solid cross-section wire comprises providing at least one solid small cross-section wire and at least one solid large cross-section wire,
providing the at least one solid large cross-section wire comprises providing a cross-section area greater than that of the at least one solid small cross-section wire,
providing the at least one solid small cross-section wire comprises disposing the at least one solid small cross-section wire in one of adjacent and proximate at least one of the at least one hollow cross-section wire and the at least one solid large cross-section wire,
providing the at least one wire winding comprises providing at least one portion, providing the at least one portion comprising providing one portion as at least one of the at least one hollow cross-section wire and the at least one solid small cross-section wire, and providing the at least one portion comprising providing another portion as at least one of the at least one hollow cross-section wire being spaced apart and the at least one solid small cross-section wire being spaced apart, and
providing the at least one wire winding comprises configuring the at least one wire winding as one of a Z-gradient coil, a uniform field coil, and a $B_0$ offset coil.

16. The method of claim 14, wherein providing the at least one solid cross-section wire comprises providing the at least one solid cross-section wire with a cross-sectional area less than that of the at least one hollow cross-section wire.

17. The method of claim 14, wherein providing the at least one solid cross-section wire comprises disposing each at least one solid cross-section wire in one of adjacent and proximate two hollow cross-section wires.

18. The method of claim 14, wherein providing the at least one solid cross-section wire comprises disposing a plurality of solid cross-section wires in one of adjacent and proximate each at least one hollow cross-section wire.

19. The method of claim 14,
wherein providing the at least one wire winding comprises configuring the at least one wire winding as a Z-gradient coil,
wherein providing the at least one solid cross-section wire comprises providing the at least one solid cross-section wire with a cross-sectional area less than that of the at least one hollow cross-section wire, and
wherein of one: providing the at least one solid cross-section wire comprises disposing each at least one solid cross-section wire in one of adjacent and proximate a plurality of hollow cross-section wires, and providing the at least one solid cross-section wire comprises disposing a plurality of solid cross-section wires in one of adjacent and proximate each at least one hollow cross-section wire.

* * * * *